United States Patent [19]

Hamilton

[11] Patent Number: 4,665,707

[45] Date of Patent: May 19, 1987

[54] PROTECTION SYSTEM FOR ELECTRONIC APPARATUS

[76] Inventor: A. C. Hamilton, P.O. Box 1090, International Falls, Minn. 56649

[21] Appl. No.: 769,510

[22] Filed: Aug. 26, 1985

[51] Int. Cl.⁴ .......................... H01B 7/34; H02B 1/00
[52] U.S. Cl. .......................................... 62/3; 62/299; 174/16 R; 361/384
[58] Field of Search ................ 62/299, 116.3; 98/39.1, 98/42.04, 116; 361/384; 174/16 R, 16 B, 16 BH, 16 HS

[56] References Cited

U.S. PATENT DOCUMENTS 3,124,720  3/1964  Green .................................. 174/16 R
4,520,424  5/1985  Carpenter et al. ............... 361/384 X
4,530,824  8/1985  Barrett et al. .

*Primary Examiner*—William E. Wayner
*Attorney, Agent, or Firm*—Robert M. Carwell

[57] ABSTRACT

A protection system for computer equipment providing a controlled power source and environment to a plurality of remote locations. An A/C supply line charges a D/C supply which is inverted to provide A/C power to the remotely located equipment which is thereby isolated from power outages and supply line fluctuations. An environmental control system is further provided including a series of filters disposed in duct work to condition supply air, whereby it is refrigerated with a Peltier-effect heat pump driven by the D/C supply or a mechanical heat pump driven by an A/C power source, in the case of very large units. A plurality of individualized supply ducts from the main duct deliver the treated air to exhaust fan ports or convection cooling openings of respective desired electronic apparatus which may include a plurality of individual personal computers and/or peripials. A universal socket is provided for each such apparatus disposed about the fan port which automatically deactivates the fan upon interconnection of a mating socket from each supply duct, whereby when the ducts are disconnected, the fans are again activated.

18 Claims, 3 Drawing Figures

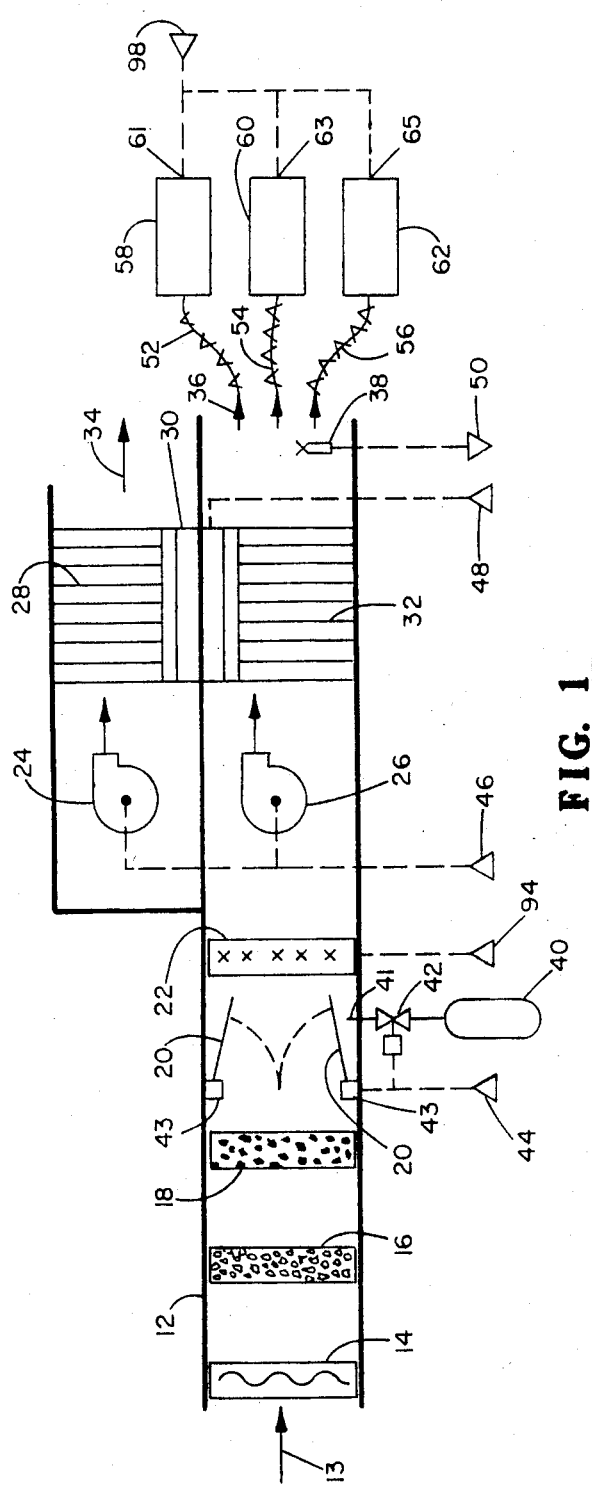
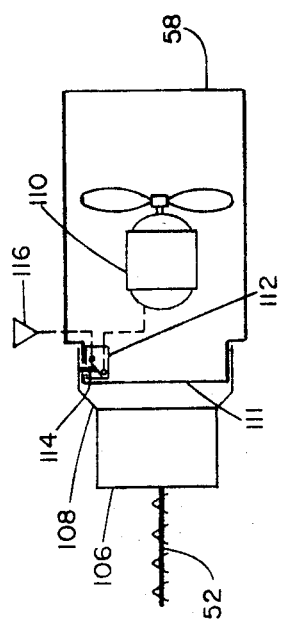
FIG. 1
FIG. 3

PROTECTION SYSTEM FOR ELECTRONIC APPARATUS

FIELD OF THE INVENTION

This invention relates to a protection system for electronic apparatus and more particularly relates to methods and apparatus for protecting individual pieces of computer equipment such as personal computers or the like by providing a controlled power source and environment at a plurality of remote locations wherein such equipment is disposed.

BACKGROUND OF THE INVENTION

It has long been known that the proper operation and useful lifetime of electronic equipment and particularly that of computer apparatus is substantially affected by the electrical power provided to the equipment as well as the environment in which the equipment operates. Accordingly, numerous methods and apparatus have been provided for improving both the manner in which power is supplied to such apparatus and the environment in which the apparatus operates.

For example, with respect to the electrical power supplies, it has been known that power outages and line transients can seriously effect the operation of computer circuitry causing serious memory loss, mechanical damage, and the like. Accordingly, it has been conventional to provide normal A/C power supply to the equipment, but to further provide for a D/C backup supply to the memory and other storage elements of a computer system whereby upon A/C power failure, at least the volatile memory will remain intact until such time as the A/C power is restored. Additionally, it is further conventional to provide for a plurality of spike and surge supressor means, voltage and line frequency regulators, filters, and the like, in an attempt to remove the effect of these line transients and the like on the computer equipment.

With respect to these electrical problems alone, the prior attempts to solve the aforementioned problems have met with several drawbacks. First, the individual components for spike and noise supression, filtering, voltage regulation and the like, collectively can result in a great deal of expenditures. Moreover, these provisions for A/C power outage provide for D/C backup supply to prevent the volatile memories from losing their information, however, the continued operation of the computer system itself, which generally works under A/C power, must be terminated until the supply line voltage is restored.

Additional problems have been encountered with remote computer terminal facilities with respect to the environments in which they operate. It has long been known that serious problems are caused by such computer apparatus operating in overheated states and in conditions wherein the ambient air quality is deleterious to the equipment. With respect to the heat problem, excessive heat of such electronic equipment frequently results in information loss of the memories, mechanical damage and lifetime problems with respect to integrated circuit chips, expansion and contraction of mechanical joints, cracking of printed circuit boards, and the like. These inadequate ventilating problems are exacerbated by the fact that ventilation requirements are often difficult to predict in the engineering of such equipment. Ventilation requirements are typically increased during product life cycles as additional add-on equipment and features are created which are not taken into account in the original design process, often simply because of cost constraints in the original designs resulting in cooling capabilities being marginal at best.

With respect to other problems associated with the ambient air in which such computer terminals operate, serious problems often result in the proper operation and useful lifetime of such equipment due to the air containing deleterious gas, corrosive components causing oxidation of electrical contacts and the like, and other undesirable matter, particulate and otherwise, present in the ambient from ozone, cigarettes, dust, moisture, and the like.

A conventional approach with respect to the ventilation and cooling requirements of remote computer terminals, instrumentation packages, and the like, has been to provide a tightly controlled environmental room in which the equipment resides. In the alternative, self contained environmental control apparatus is frequently provided with respect to individual pieces of apparatus. With respect to the environmental room approach, it is readily apparent that this solution can be cost prohibitive as well as generally impractical in situations wherein a plurality of remote equipment locations are necessary as, for example, in the process control arts. Moreover, with respect to the approach of providing each individual piece of equipment with self contained apparatus for improving the environment, this approach also has obvious drawbacks. First, such a solution adds to the bulk of each piece of equipment which must have separately dedicated filters, ventilator fans, and the like. Secondly, expenses of an overall system are substantially increased due to the need to provide environmental conditioning apparatus for each piece of computer equipment resulting in unnecessary duplication. For the aforementioned reasons, it has not been uncommon to find individual pieces of computer equipment which, for example, are so poorly ventilated as to require replacement of the design ventilator fan with a retrofitted fan having greater capacity.

Still further with respect to environmental protection of such equipment, fire detection and extinguishment features have been limited to the entire room housing the equipment. Detection is thus too late to provide early protection of the affected equipment and requires very large quantities of suppressants because the entire room must be filled. In addition, there exists danger to occupants of the rooms with suppressants. The installation of dedicated detection and extinguishing features to individual components has also frequently been cost prohibitive.

For the foregoing reasons, an improved protection system for electronic apparatus was highly desired and sought after for use with a plurality of remotely located units such as portable computer systems or the like. More particularly, such a system was desired which provided electrical power to such units free of the aforementioned problems regarding loss of power, line transients and the like. Additionally, such an improved system was desired which economically provided a controlled environment for each such unit without requiring dedicated apparatus for each unit to control the environmental problems associated therewith.

SUMMARY OF THE INVENTION

A protection system is provided for a plurality of remotely located computer or other electronic equipment units providing a controlled power source and environment to the units.

In a preferred embodiment, a source of alternating current is delivered to a rectifier which charges a storage battery. D/C power from the storage battery is routed to a sinewave inverter, the output of which is preferably a 60 Hz alternating current power source delivered to each of the remote units whereby the thus-delivered alternating current power is isolated from A/C supply line power outages, line transients, and the like.

A central air conditioning unit is provided having main ducts housing, in series, a composite dust filter, a molecular sieve water filter, an activated carbon gas filter, an electrostatic filter, and two heat removal fans or one fan providing two airstreams. Disposed between the carbon gas filter and the electrostatic filter is an automatically controllable fire door means for preventing intake air outside the main duct from passing through the electrostatic filter as hereinafter described. A Peltier-effect or mechanical heat pump is provided having a hot side heat sink and a cold side heat sink. One of the heat removal fans delivers filtered air from the main duct after passing through the electrostatic filter to the hot side. The remaining heat removal fan delivers such air to the cold side of the heat pump which is energized from the D/C supply storage battery or A/C line power. Filtered air passed by the removal fan across the hot side heat sink is discharged to the ambient. Air flexible conductive air hosing ducts. Each air hose duct is delivered to a respective desired one of a plurality of remote electrical equipment units such as a personal computer or the like. Each duct is terminated by a universal socket interconnectable to the exhaust fan port of each electrical equipment unit. The universal socket is adapted to fit around the exhaust fan duct and includes a switch means wired in series with the exhaust fan of the particular electronic unit. Accordingly, in this manner, when the ducting for a particular unit is interconnected to the unit, the switch is automatically opened thereby deactivating the exhaust fan of the unit so as to receive the conditioned air through its respective ducting and exhaust port into the unit. Positive pressure conditioned air is thereby delivered to the interstices of the unit and forced outwards of any apertures in the unit housing, thereby preventing in-flow of undesirable untreated ambient air about the unit. A plurality of fire detection transducers are located at desired locations such as at each socket so as to detect presence of a fire at the unit. In response to such a detected signal, a fire detection control circuit will generate a control signal sealing off the fire doors in the main duct and activating a fire extinguisher medium supply. More particularly, disposed between the activated carbon gas filter and the electrostatic filter in the main duct will preferably be a port having in series therewith the fire extinguishing medium supply and a control valve therebetween which is electrically operated by the fire detection control signal. Upon such detection of fire, the control signal will open the control valve so as to discharge the fire extinguishing medium such as a halogen gas or the like into the main duct, which is thereby transmitted through the hose ducting to the electrical apparatus unit thereby extinguishing the fire.

BRIEF DESCRIPTION OF THE DRAWINGS

FIG. 1 is a schematic diagram illustrating a portion of the protection system of the present invention.

FIG. 3 is a pictorial illustration of a universal duct socket assembly of the present invention.

DETAILED DESCRIPTION OF THE INVENTION

Figure 2:
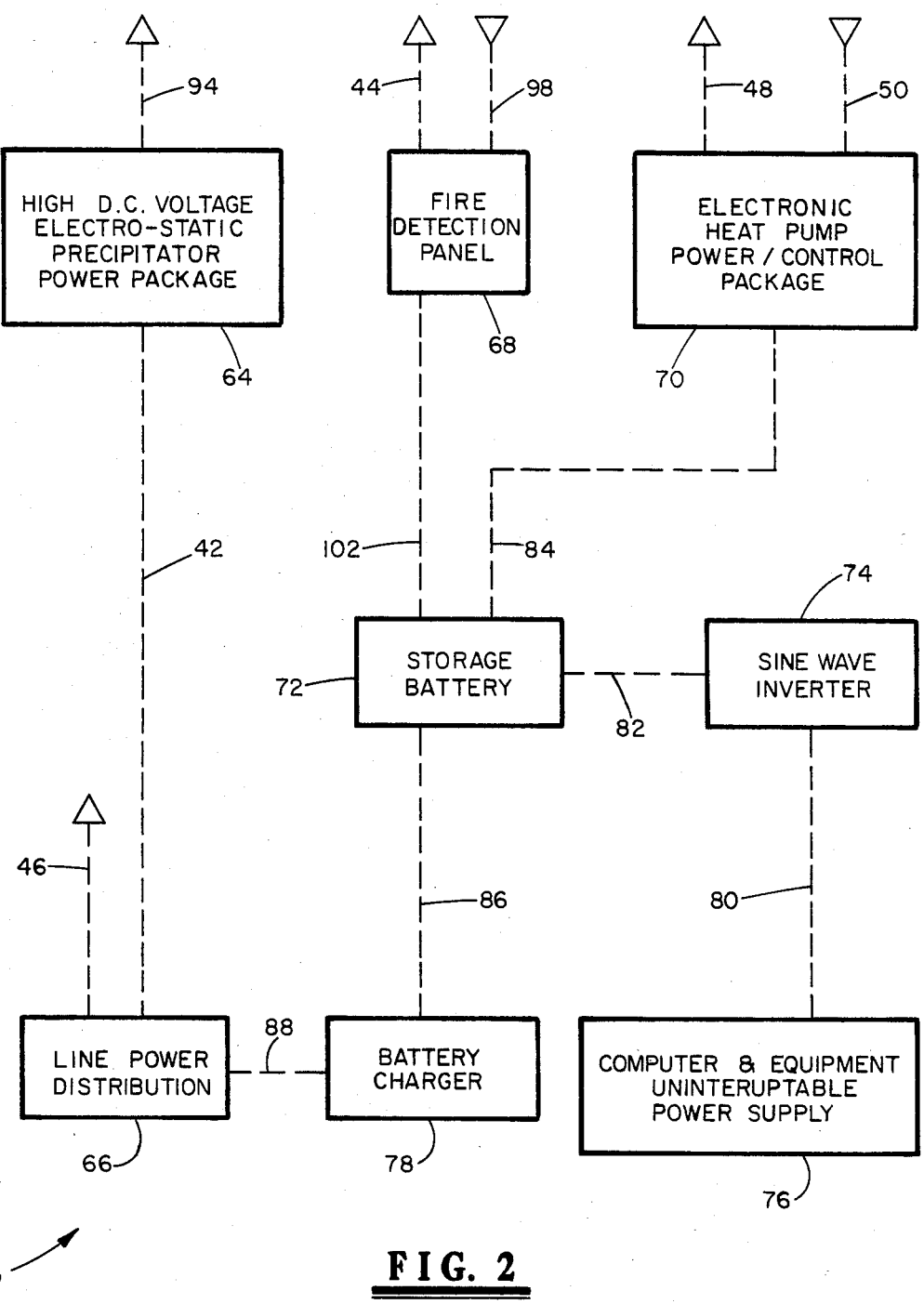
FIG. 2 is a schematic diagram illustrating an additional portion of the protection system of the present invention, including the electrical supply system in block diagram form.

Referring first to FIG. 1, there will be seen depicted therein generally a protection system 10 of the present invention which, in turn, is generally comprised of a central air conditioning unit 11, an electrical power and control unit 15 (depicted in FIG. 2), and a plurality of air ducts 52, 54, and 56 interconnected between the air conditioning unit 11 and a respective plurality of remote electrical equipment units 58, 60, and 62.

With reference first to the central air conditioning unit 11, a main duct 12 is preferably provided which receives ambient air through an intake port 13. A composite dust filter 14 is disposed within the main duct 12 for trapping relatively larger diameter particulate matter which might impede air flow through successive filters to be hereinafter described.

After the dust filter 14, a molecular sieve water filter 16 of a form well known in the art may be provided also disposed within the main duct 12. The purpose of filter 16 is to dry the air received through port 13 in a manner so as to allow small suspended particles to accept and maintain charges imparted by the cathode of an electrostatic filter 22 to be hereinafter described for more efficient anode collection and cleaning action of the supply air. An additional purpose of filter 16 is to prevent water condensation on the cold side heat sink assuring water droplets will not be carried into the protected equipment.

Still referring to FIG. 1, after the water filter 16, an activated carbon gas filter 18 is thence preferably disposed within the main duct 12, followed by an electrostatic filter 22 also well known in the art. The purpose of gas filter 18 being disposed before the electrostatic filter 22 is to trap carbon fines and like particulate matter suspended within the air to avoid deleterious effects to the high voltage portions of the protected equipment 58, 60, and 62 such as their being shorted out by flyash suspended in the air from operation in a boiler control room, as but one application example. Situated between the gas filter and electrostatic filter will be a fire door means 20 which is automatically activated in a manner to be hereinafter described and will seal off the main duct 12 so as to prevent ambient air from flowing through the input port 13 and the aforementioned filters and through the electrostatic filter 22. Also disposed between the gas filter and electrostatic filter in the main duct 12 will be a port 41 interconnected, in series, to an automatic control valve 42 and a fire extinguisher medium supply 40. The fire door means 20 are also provided with an automatic control 43. In operation, in a manner to be described hereinafter in greater detail, in response to an automatic control signal 44, indicating presence of fire in one of the electrical equipment units 58, 60, and 62, the control 43 will be activated to close the fire door means 20 and the control valve 42 will be activated so as to deliver the fire extinguishing medium contained in the supply 40 through the control valve 42 and input 41 and thence into the main duct 12 for delivery through the ducts 52-56 to the corresponding units 58, 60, and 62.

Still referring to FIG. 1, a plurality of heat removal fans 24 and 26 are provided disposed within the main duct 12 and after the electrostatic filter 22 for purposes of drawing air from the intake port 13 through the filters 14, 16, 18, and 22 through the heat sinks of a heat pump 30 to be hereinafter described. The purpose of the electrostatic filter 22 is to remove smoke, bacteria, gases and mold particles and the like suspended within the supply air which may be deleterious to the units 58, 60, and 62.

Still referring to FIG. 1, and in particular to the heat pump 30, it will preferably be of a solid-state type operating under the principle known as the Peltier effect and will accordingly include a hot side heat sink 28 and a cold side heat sink 32. The removal fan 24 will flow a portion of the intake air entering the main duct 12 through the port 13 across this hot side heat sink 28 which is thence discharged to the ambient as schematically depicted by arrow 34 as hot air. In like manner, the removal fan 26 will flow another portion of the intake air across the cold side heat sink 32 to a cool air output port 36 which comprises a portion of the main duct 12.

Interconnected to the output port 36 there will be seen depicted a plurality of air hose ducts 52, 54, and 56. Whereas only three such ducts have been illustrated, it is fully contemplated by the present invention to provide as many ducts as desired dependent upon the number of units 58 which are to be provided with controlled air supplies. In like manner, it will be noted from FIGS. 1 and 3 that only one such remote equipment unit 58 has been depicted for illustrative purposes in more detail. However, the invention contemplates that each such desired duct 52-56 will terminate at a corresponding equipment unit, although only one has been depicted for clarity. The ducts 52-56 will preferably be of a flexible grounded conductive air hose. The purpose of the ducting preferably being of a conductive type is basically two-fold. First, inasmuch as the air flowing through the ducting, due to prior treatment, has been substantially dried, it would naturally have a tendency to build up high static charges due to air flow through the ducts which may be deleterious to electrical units 58-62. Moreover, such electrically charged air would further have a tendency to charge particles still suspended therein which, when delivered to the units 58 would have a tendency to undesirably adhere to the units. Accordingly, by providing conductive ducting, these undesirable tendencies to result in charged air and charged particles will be subtantially removed.

The electrical power and control unit 15 will now be described in greater detail with reference to the accompanying FIG. 2. The system 10 will preferably be powered by a conventional 60 cycle alternating current supply source, as functionally depicted by line power distribution 66. This power will be delivered on line 42 to an appropriate high voltage direct current electrostatic precipitator power package 64 which converts this A/C power to an appropriate high voltage D/C level which is then delivered by supply line 94 to the electrostatic filter 22. The conventional A/C power will further be delivered by line 46 to the removal fans 24 and 26 for conventional operation thereof.

With respect to the power supply for the system 10, still with reference to FIG. 2 and the electrical power and control unit 15, the system 10 will be provided with an A/C operated battery charger 78 which has delivered thereto A/C power from the power supply 66 on line 88. The charger 78 is of a conventional D/C rectifier type which delivers charging D/C current on line 86 to a storage battery 72. The battery 72, in turn, provides on line 82 a source of D/C current to a sign wave inverter 74 which converts this D/C current back to alternating current delivered on line 80 to the desired remote electrical equipment units 58-62, as schematically indicated by terminals 76. The storage battery 72 will also preferably deliver D/C power on line 84 to a suitable electronic heat pump power and control package 70 for use with the heat pump 30. From FIG. 1, it will be noted that a temperature transducer 38 my be provided in the output port 36 for measuring the temperature of the air flowing therethrough to the ducts 52-56. The output of this transducer 38 which will be developed as temperature signal 50 will be delivered to the control package 70 for providing automatic control of the temperature of the cool air. In response to this temperature transducer signal 50, the control package 70 will generate appropriate control signals 48 which are delivered to the heat pump 30. In this manner, in response to the control signals 48, the heat pump 30 will cycle on and off as required and as desired to maintain the temperature of the air flowing through the output port 36 within a desired temperature range dependent upon the requirements of the equipment units 58-62.

The storage battery 72 will further deliver D/C power on line 102 to an appropriate fire detection circuit 68 for powering the circuit. Comparison of FIGS. 1 and 2 will indicate that ionization sensors 61, 63, and 65 will be located adjacent the terminations of ducts 52, 54, and 56 at respective units 58, 60, and 62. The purpose of these sensors is to detect smoke adjacent these terminations and to convey these measurements or indications on sensor line 98 to the detector 68. The detector 68 will monitor these signals on line 98 and generate a control signal 44 when any one of the sensors generates a signal indicating presence of a fire adjacent the units 58, 60, and 62. The control signal 44 will be delivered to the fire door means control 43 and the previously described automatic valve 42. When presence of a fire is detected at the terminations 106, 60, or 62 by the fire detector control 68 monitors the signal 98, this control signal 44 will shut down removal fan 26, cause the fire door means 20 to activate and close off the main duct 12 while at the same time energizing the control valve 42. In this manner, the fire extinguisher medium stored in the supply 40 will be released through the control valve 42 and into the main duct 12. The natural expansion of the fire extinguishing medium which may be a halogen gas or the like will cause it to travel from the supply 40 through the main duct 12, out the output port 36, through the ducts 52-56, to the equipment units 58-62 for extinguishment of the fire.

Several features may be noted with respect to the previously described power and control unit 15. First, if the source of alternating current 66 fails, this will not affect electronic memory and storage elements residing in units 58-62 such as random access memories, read only memories, and the like inasmuch as sufficient residual power will remain in the storage battery 72 to operate such memory and storage units notwithstanding that A/C power failure will cause the battery charger 78 to discontinue providing a re-charging current on line 86 to the battery 72. Whereas it will be noted that it is conventional to provide for an emergency D/C supply to maintain storage elements in computer equipment upon general A/C power failure, it is not conventional for such backup systems to provide backup A/C power to the entire equipment unit 58 for its continued operation. However, due to the presence of the inverter 74, notwithstanding power failure of the general A/C source 66, A/C power will still be provided to the equipment units 58-62 by outlets 76 interconnected to the inverter 74. Moreover, from the foregoing, it will be appreciated that such A/C power provided to the equipment units 58-62 by the terminals 76 will be isolated from line surges, noise, under voltages, frequency variations, and the like which are associated with general A/C power supply sources 66. This is so because the A/C power provided by the outlets 76 for operating the equipment units 58 originates in a stable D/C source from the battery 72 which is converted into alternating current form by the inverter 74. Thus, significant improvements in the operation and reliability thereof and lifetime of the components of the equipment units 58-62 may be realized from the power unit 15 of the present invention.

Referring now to FIG. 3, a preferred embodiment of the manner of connection of the ducts 52-56, to the respective equipment units 58-62 will be seen depicted therein. More particularly, each such duct 52-56 will preferably include a universal socket comprised of a first socket end 106 disposed on the end of a respective one of the ducts 52-56, and a second socket end 108 disposed on each equipment unit 58-62. The first and second socket ends 106 and 108 are preferably of any well known design whereby they may be brought into sealedly mating engagement with one another. The second socket end 108, moreover, is preferably of a universal type which may easily be mounted about the exhaust fan port 111 of each equipment unit 58-62, whereby when the first and second socket ends 106 and 108 are brought into sealed engagement, the conditioned air flowing through the ducts 52-56 will thereby be made to flow through the exhaust fan ports 111 into the interstices of the respective equipment units 58-62.

The second socket end 108 is further preferably provided with a switch 114 wired in series with the fan 110 of the particular equipment unit 58-62, thereby creating a series circuit 116 with the fan 110 and the switch 114, which is interconnected to the power supply 76. The switch 112 preferably further includes a shaft 114 whereby when the first and second socket ends 106 and 108 are brought into sealing engagement, the switch 112 will operate so as to break the series circuit 116 and disengage the fan 110 from the power source 76, thereby permitting flow of conditioned air into the equipment units 58-62. However, upon disconnecting the first and second socket ends 106 and 108, the means 114 will operate the switch 112 so as to cause the fan 110 to be energized. From the foregoing, it will be appreciated that when the ducts 52-56 are interconnected to their respective equipment units 58-62, conditioned air will be supplied to the equipment units 58-62. However, when the ducts 52-56 are thereby disconnected from the equipment units 58-62, each respective fan 110 in the equipment, units 58-62 will thereby be activated so as to permit continued conventional operation of the equipment units 58-62 wherein their own dedicated fans 110 provide the necessary ventilation for their respective units 58-62. This feature is particularly convenient wherein the equipment units 58-62 are portable computers or other terminals or the like which may be desirably operated individually or in concert with other units and from a variety of locations wherein the internal ventilation features thereof are desirably still to be engaged at selected times. Yet an additional feature of the hereinbefore described system relates to the positive pressure of conditioned air being introduced into the exhaust ports 110 of the equipment units 58-62. Each equipment unit 58-62 typically will have a number of locations whereby undesirable ambient air disposed about the equipment units may enter into the interstices thereof, thereby causing damage by corrosion, heat, and the like. Examples of this might include input/output ports of disc drives, spaces about individual keys in keyboard terminals of computers, and the like. By providing the positive pressure of conditioned air being input into the exhaust port 111 of the equipment units 58-62, this positively pressured conditioned air will thereby be forced outwards of these openings in the equipment units 58-62 which normally would otherwise be drawing ambient air through them into the internal portions of the equipment unit 58-62 (particularly in view of the normal operation of the exhaust fans 110 continually evacuating the insides of the equipment units 58-62). However, by a provision of this positive pressure, undesirable entrance of ambient air through the aforementioned locations is prevented, thereby further maintaining the internal environment of the equipment units 58-62 and desired states wherein the interstices are occupied by conditioned and temperature controlled air.

It will be appreciated that in an alternate embodiment, the invention need not be limited to the universal sockets depicted in FIG. 3. Alternatively, for example, with respect to convection-cooled equipment units 58-62, plenum boxes may be installed on the exhaust outlets 111 and sealed with foam tape or in some other conventional manner to nevertheless still achieve the desired positive-pressure ventilating effects hereinbefore described.

It is therefore apparent that the present invention is one well adapted to obtain all of the advantages and features hereinabove set forth, together with other advantages which will become obvious and apparent from a description of the apparatus itself. It will be understood that certain combinations and subcombinations are of utility and may be employed without reference to other features and subcombinations. Moreover, the foregoing disclosure and description of the invention is only illustrative and explanatory thereof, and the invention admits of various changes in the size, shape and material composition of its components, as well as in the details of the illustrated construction, without departing from the scope and spirit thereof.

What is claimed is:

1. A system for protecting electronic apparatus, comprising:

a central air conditioning unit having an output port;

a plurality of equipment units remotely located from said air conditioner unit each having an input-exhaust port means for expelling air from within said each equipment unit when said unit is disconnected from said central air conditioning unit, and receiving air from said central air conditioning unit when connected to said unit; and a plurality of ducts each interconnected at one end to said output port and at the other end to a respective different one of said input-exhaust ports of said plurality of equipment units;
wherein said equipment units each include
an exhaust fan connected to a power source; and
wherein said system further includes
universal connector means for said interconnection of said plurality of ducts to said respective different ones of said input-exhaust ports of said plurality of equipment units whereby said exhaust fans are disconnected from said power source during said interconnection and connected to said power source when said plurality of ducts are disconnected from said respective different ones of said input-exhaust ports; and wherein each said universal connector means includes
switch means interconnected in series with said exhaust fan and said power source; and
means for activating said switch means when said universal connector means interconnects said duct to said respective exhaust port.

2. The apparatus of claim 1, wherein said system further includes:
electrical power and control unit means including
direct current storage battery means for generating a direct current;
battery charger means for charging said battery means from a source of alternating current;
inverter means for converting said direct current into an alternating current; and
terminal means for delivering said converted alternating current to said plurality of equipment units.

3. The apparatus of claim 1, further including:
a plurality of combustion detector means each disposed adjacent a respective one of said equipment units for generating a combustion control signal indicating presence of combustion in at least one of said plurality of equipment units; and
combustion extinguisher medium means for delivering a combustion extinguisher medium into said air conditioning unit in response to said combustion control signal.

4. The apparatus of claim 1, wherein said air conditioning unit further includes a peltier-effect heat pump means interconnected to said direct current storage means.

5. The apparatus of claim 1, wherein said plurality of ducts includes conductive means for reducing the electrical charge of air particles suspended therein.

6. The apparatus of claim 1, wherein said air conditioning unit further includes:
an intake port; and
a main duct defining an air flow circuit from said intake port to said outtake port; and
wherein disposed, in order, between said intake port and said outflow port in said main duct are
dust filter means for filtering out particulate matter suspended in said flow circuit;
drying means for drying air in said flow circuit; and
electrostatic filter means.

7. The apparatus of claim 6, wherein said drying means is a molecular sieve filter.

8. The apparatus of claim 6, further including gas filter means disposed in said duct between said drying means and said electrostatic filter means.

9. The apparatus of claim 8, wherein said gas filter means is an activated carbon filter.

10. The apparatus of claim 3, wherein said air conditioning unit includes:
a main duct; and wherein
said combustion extinguisher medium means includes
an input port in said main duct;
a combustion extinguisher medium reservoir containing a combustion extinguisher medium; and
an automatic control valve means responsive to said combustion control signal and disposed between said input port and said reservoir for controlling flow of said medium from said reservoir through said valve to said input port.

11. The apparatus of claim 10, further including:
combustion door means disposed in said main duct between said gas filter means and said electrostatic means for regulating flow of air through said circuit in response to said combustion control signal.

12. The apparatus of claim 4, wherein said heat pump means is interconnected to said D/C storage battery means.

13. The apparatus of claim 12, wherein said heat pump means is disposed in said main duct between electrostatic filter and said output port.

14. A method for protecting electrical apparatus, comprising:
establishing a flow of air;
conditioning said air flow;
directing said conditioned air flow to a plurality of discrete remote locations; and
introducing said directed air flows into respective intake-exhaust ports of a corresponding plurality of electrical equipment units positioned at respective ones of said remote locations, disconnecting a unit from conditioned air flow and simultaneously energizing an air exhausting device so that air is exhausted from said unit via said intake-exhaust port whenever the unit is not connected to the conditioned air flow.

15. The method of claim 14, wherein said step of conditioning said air flow comprises cooling, filtering, and de-humidifying said air flow.

16. The method of claim 15, further including:
detecting presence of combustion at one of said plurality of said remote locations; and
introducing into said air flow a combustion-extinguishing agent in response to said detected combustion.

17. The method of claim 16, further including regulating said flow of air in response to said detected combustion.

18. The method of claim 17, further including:
converting a flow of alternating electrical current into a flow of direct electrical current;
energizing a storage battery with said converted direct electrical current;
establishing a flow of direct current from said storage battery;
converting said flow of direct current from said storage battery into a second current of alternating electrical energy; and
cooling said air flow in response to said second current of alternating electrical energy.

* * * * *